United States Patent [19]

Kurosawa

[11] 4,371,407

[45] Feb. 1, 1983

[54] METHOD FOR PRODUCING SEMICONDUCTOR DEVICE

[75] Inventor: Kei Kurosawa, Toyko, Japan

[73] Assignee: Tokyo Shibaura Denki Kabushiki Kaisha, Kawasaki, Japan

[21] Appl. No.: 315,909

[22] Filed: Oct. 28, 1981

[30] Foreign Application Priority Data

Oct. 28, 1980 [JP] Japan ................................ 55-150992
Apr. 17, 1981 [JP] Japan ................................ 56-57899

[51] Int. Cl.³ .................... H01L 7/44; C23C 15/00
[52] U.S. Cl. .................................. 148/187; 148/1.5; 204/192 E; 204/192 EC
[58] Field of Search ................ 204/192 EC, 192 E; 148/1.5, 187

[56] References Cited

U.S. PATENT DOCUMENTS

| | | | |
|---|---|---|---|
| 3,940,506 | 2/1976 | Heinecke | 427/38 |
| 4,140,547 | 2/1979 | Shibata et al. | 148/1.5 |
| 4,179,311 | 12/1979 | Athanas | 148/1.5 |
| 4,244,799 | 1/1981 | Fraser | 204/192 E |
| 4,283,249 | 8/1981 | Ephrath | 204/192 E |
| 4,293,375 | 10/1981 | Neukomm | 204/192 E |
| 4,311,533 | 1/1982 | Roche | 148/187 |
| 4,333,793 | 6/1982 | Lifshitz | 204/192 E |

FOREIGN PATENT DOCUMENTS 138850 11/1979 Fed. Rep. of Germany.

OTHER PUBLICATIONS

E.C.S. Spring Meeting Extended Abstract 157, No. 99 263 (1980), T. Arikado and S. Horiuchi, May 11-16, (1980).
Journal of the Electrochemical Society—Extended Abstracts, vol. 80, No. 1, May 1980, Princeton.

*Primary Examiner*—Arthur P. Demers
*Attorney, Agent, or Firm*—Oblon, Fisher, Spivak, McClelland & Maier

[57] ABSTRACT

A method for producing a semiconductor device comprises the steps of:
 forming a first material film on a semiconductor substrate;
 forming a second material film on said first material film;
 selectively removing said second material film;
 exposing a structure thus formed to a gas plasma atmosphere to form a plasma polymerization film on at least an exposed surface of said first material film;
 removing a remainder of said second material film; and
 removing the exposed surface of said first material film by using said plasma polymerization film as a mask to form a first material film pattern.

9 Claims, 18 Drawing Figures

METHOD FOR PRODUCING SEMICONDUCTOR DEVICE

BACKGROUND OF THE INVENTION

The present invention relates to a method for producing a semiconductor device and, more particularly, to a method for producing an improved semiconductor device which has a means for forming a material film pattern.

Formation of the material film pattern in a conventional method for producing a semiconductor integrated circuit is accomplished wherein a resist film is coated on a film to be etched, the resist film is selectively exposed to light and developed to obtain a predetermined resist pattern, and the film to be etched is etched using the obtained resist pattern as a mask. In particular, dry etching techniques have been developed extensively, for example, reactive ion etching utilizing an etching system of parallel planar electrode type which substantially eliminates side etching. In this manner, the resist pattern is precisely transferred to the film to be etched.

However, when the etching techniques are changed, the resistance of the resist film to etching entails problems. When reactive ion etching is used, the resist film is also etched. Therefore, a desired material film pattern is not obtained.

In order to solve this problem, a second material film which allows sufficiently selective etching is formed on a first material film. The second material film is patterned by photolithography to form a second material film pattern. The first material film is then etched utilizing the second material film pattern as a mask. In this way, a mask-transfer technique is achieved. However, this technique has problems in that the steps are very complicated, stress is generated or chemical reaction may occur between the first material film and the second material film so that the film quality is degraded, and the second material film on the first material film pattern is hard to remove due to the etching selectivity between the exposed material under the first material film pattern and the second material. When reactive ion etching is used for removing the first material film using the second material film pattern as the mask, part of the second material film is decomposed during etching and a new etching species is produced so that side etching of the first material film adversely occurs due to this etching species.

In the conventional MOS type semiconductor integrated circuit, on an area between adjacent elements, that is, in the field region, a relatively thick field insulating film is formed for the purpose of due to element isolation. Further, a channel stopper of high impurity concentration which has the same conductivity as the semiconductor substrate is formed under the field insulating film to increase the inversion voltage of the field region. As a method for forming the field insulating film and the channel stopper thereunder, the selective oxidation method has recently been utilized. According to this method, a silicon nitride film is deposited on a silicon substrate with a thin silicon oxide film interposed therebetween. The silicon nitride film is selectively etched except for an element formation region and the remaining area of the silicon nitride film is used as a mask for ion implantation. Ion implantation is performed for forming the channel stopper and, by using the same silicon nitride film as the mask, a thick oxide film is selectively deposited on the field region by high temperature thermal oxidation. Thereafter, the silicon nitride film is removed and the thin silicon oxide film thereunder is then removed to form elements on the exposed substrate by a known process. According to this method, the photoetching process is required only once when the silicon nitride film is selectively etched. Further, since the insulating film of the field region and the channel stopper are self-aligned, the method described above has advantages in that the manufacturing cost is low and the masking error need not be considered.

However, the following problems are present when the selective oxidation method is used for isolating elements in an integrated circuit in which compactness and high packaging density are developed.

Firstly, a nitride compound produced from the silicon nitride film used as the oxidation resistant mask in the selective thermal oxidation described above is diffused in the silicon oxide film under the silicon nitride film and a nitride compound is produced on the surface of the silicon substrate. This nitride compound prevents formation of a gate oxide film, degrades the dielectric strength of the gate oxide film, and causes fluctuations in the gate threshold voltage, when part of the silicon substrate for the element formation region is exposed and the gate oxide film is formed by thermal oxidation. Secondly, when a thick field oxide film is selectively formed, oxidation proceeds in the transverse direction and the thick field oxide film extends in the form of a bird beak under the silicon nitride film as an oxidation resistant mask. Therefore, dimensional errors of the element formation region occur, preventing high packaging density. Thirdly, in order to form the thick field oxide film, annealing is required at high temperature and for a long period of time, for example, 1,000° C. for 5 hours, in an oxidizing atmosphere containing water vapor. Therefore, an impurity which is already ion-implanted in the field region will be diffused into the element formation region, the field stopper will be rearranged, and the element characteristics will be degraded.

SUMMARY OF THE INVENTION

It is one object of the present invention to provide a method for producing a semiconductor device according to which a minute film pattern of various materials may be formed with high reliability and in accordance with simple steps.

It is another object of the present invention to provide a method for producing a semiconductor device which is highly integrated and which has a high packaging density of extremely small elements.

It is still another object of the present invention to provide a method for manufacturing a semiconductor device which is capable of forming a field stopper and an insulating film for element isolation by a single photolithography step.

According to an aspect of the present invention, there is provided a method for producing a semiconductor device comprising the steps of:

forming a first material film on a semiconductor substrate;

forming a second material film on said first material film;

selectively removing said second material film;

exposing a structure thus formed to a gas plasma atmosphere to form a plasma polymerization film on at least an exposed surface of said first material film;

removing a remainder of said second material film; and removing the exposed surface of said first material film by using said plasma polymerization film as a mask to form a first material film pattern.

According to a method for producing a semiconductor device with the structure described above, an elaborated pattern is stably formed with simple steps and the element characteristics are not degraded, so that a highly integrated semiconductor device is provided which has a high packaging density with extremely small elements.

DESCRIPTION OF THE PREFERRED EMBODIMENTS

According to the present invention, a polymer pattern having an excellent resistance to etching is formed on a film to be etched by plasma polymerization. This polymer pattern is used as a mask and the film is etched to obtain a minute material film pattern with high reliability.

Preferable embodiments according to the present invention will be described below.

A second material film is deposited on a first material film which is to be etched, and the second material film is patterned by general photolithography. These processes are performed in conventional patterning. According to the present invention, the obtained structure is exposed to a predetermined plasma atmosphere, whereby the patterned second material surface is etched by plasma gas while at the same time a plasma polymer film is grown on the exposed first material film.

Figure 1:
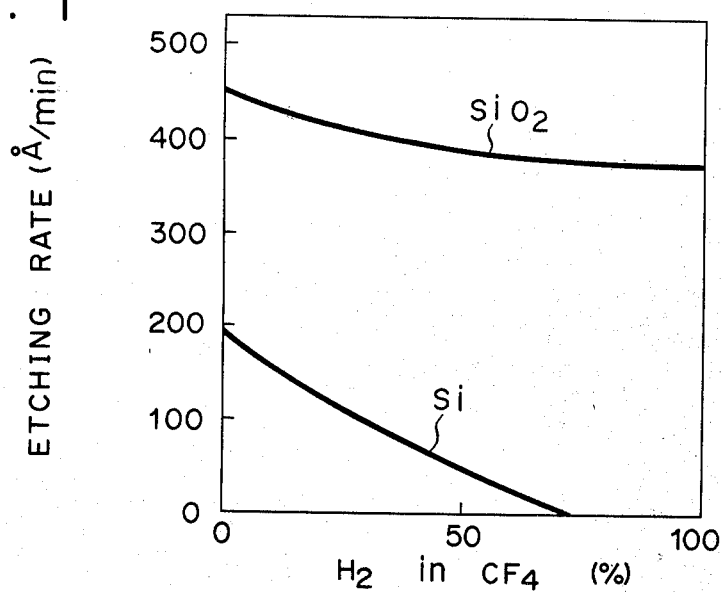
FIG. 1 is a graph for explaining the relation between the ratio of $H_2$ to $CF_4$ and the etching rate when reactive ion etching is performed on silicon and silicon dioxide.

The plasma etching and the deposition of the plasma polymer film are simultaneously performed in accordance with proper selection of the first and second material films and the conditions of the plasma atmosphere. These will be described with reference to FIGS. 1 and 2. FIG. 1 shows etching characteristics of Si and $SiO_2$ when reactive ion etching is performed. The etching conditions are as follows: the RF power is 0.22 W/cm$^2$, the pressure is 10 m Torr, the atmosphere is a gas mixture of $CF_4$ and $H_2$ in which the flow rate of $CF_4$ is 21 ml/min and the flow rate of $H_2$ is variable. As is apparent from the figure, when the flow rate of $H_2$ increases, the etching rates of Si and $SiO_2$ gradually decrease. However, when the proportion of $H_2$ gas to $CF_4$ gas exceeds about 70%, the etching rate of Si becomes 0 Å/min. At the same time, a plasma polymer film of $CF_x$ begins to be deposited on the Si film. The same phenomena occur when an Al film is adopted. With an increase in the $H_2$ concentration, a plasma polymer film of $CF_x$ is deposited on the Al film. Therefore, with an increase in the $H_2$ concentration, the $SiO_2$ film is etched while at the same time the plasma polymer film is deposited on the Si or Al film during reactive ion etching.

Figure 2:
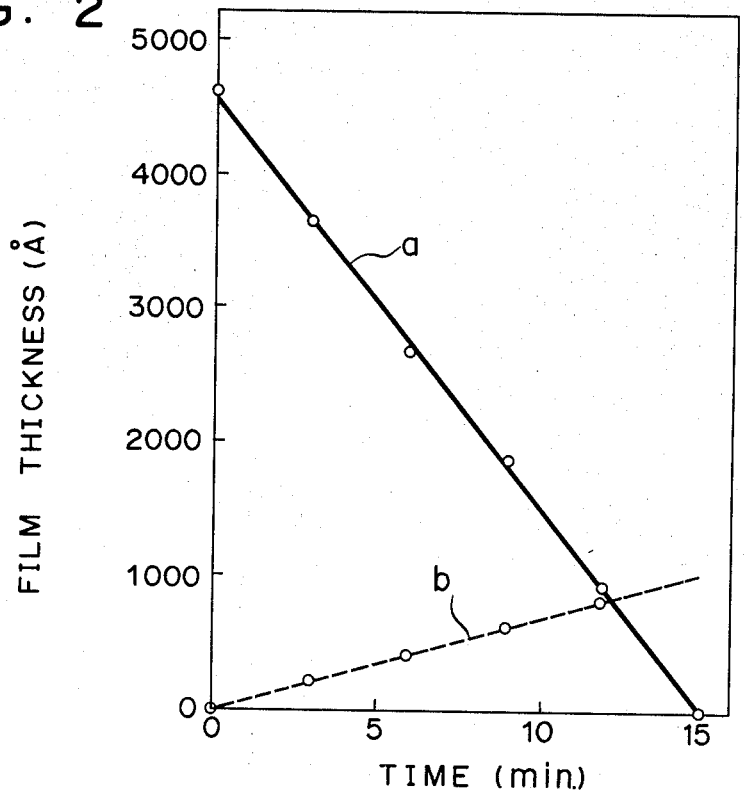
FIG. 2 is a graph for explaining changes in time of the film thickness of a polymer film on a polysilicon film and a CVD silicon dioxide film thickness, when exposed to a reactive ion etching atmosphere.

Referring to FIG. 2, changes in time of a film thickness (line a) of a CVD $SiO_2$ film and changes in time of a film thickness (line b) of a polymer film deposited on a poly-Si film are shown when the CVD $SiO_2$ film and the poly-Si film are exposed to an atmosphere for reactive ion etching. The conditions of the reactive ion etching are as follows: the pressure is 0.01 Torr, the flow rate of $CF_4$ is 20 ml/min, the flow rate of $H_2$ is also 20 ml/min, and the RF power is 0.22 w/cm$^2$. When the pattern is formed according to the present invention, the etching time is determined so that the film thicknesses of the films are substantially the same. It is noted here that a plasma polymer film is not deposited by a plasma on the $SiO_2$ film since the oxygen in the $SiO_2$ film reacts with carbon in the plasma gas to produce carbon dioxide.

In this manner, when the second material film is partially etched in the plasma gas, a plasma polymer film is deposited on the exposed surface of the first material film. Thereafter, the remaining second material film is etched and removed. The plasma polymer film is used as the mask and the first material film is etched to stably obtain the desired pattern. This plasma polymer film is easily removed by, for example, $O_2$ plasma ashing or an aqueous solution mixture of sulfuric acid and hydrogen peroxide, and the reliability of pattern formation is greatly improved as compared with the conventional method. Further, stres is not generated and chemical reaction does not occured between the first material film and the plasma polymer film. The etching selectivity of the polymer film with the first material film is also greatly improved.

As a gas atmosphere in which a plasma polymer film is deposited on the Si or Al film, the gas mixture is not limited to the gas mixture of $CF_4$ and $H_2$ as described above. A gas mixture of a fluorocarbon gas such as $C_2F_6$ or $C_3F_8$ and $H_2$ may also be used. Further, the gas atmosphere is not limited to gas mixtures, but may be extended to a single gas such as $CHF_3$. As a result, any gas which contains the CF bond and an H atom may be used for depositing a plasma polymer film on the Si or Al film. When a gas mixture of a fluorocarbon and $H_2$ is used, the proportion of the $H_2$ gas is preferably at least 30% of the gas mixture.

In the embodiment described above, the second film pattern surface is etched and at the same time the plasma polymer film is deposited on the exposed surface of the first material film. The mask pattern is thus constituted by the plasma polymer film. However, the present invention is not limited to this. The plasma polymer film mask pattern may also be obtained by a lift-off method in which a plasma film is also formed on the second material film pattern, and the second material film pattern and the plasma film deposited thereon are both removed.

A case will be described in which the method for forming the material film pattern described above is applied for producing an MOS type semiconductor device.

A relatively thick insulating film to be a field insulating film is formed on the entire surface of a semiconductor substrate. The first material film, for example, a poly-Si film, is deposited thereon. By photolithography, a resist film pattern which is the second material film is formed on the element formation region of the first material film. The resist film pattern is then used as the mask, and an impurity is ion-implanted into the semiconductor substrate to form a field stopper. The acceleration voltage of ion implantation is set at a relatively high level to implant ions within the field region of the semiconductor substrate. The obtained structure is exposed to a plasma atmosphere, and a plasma polymer film is deposited on the first material film and the resist film pattern. Thereafter, the resist film and the plasma polymer film thereon are both removed. A plasma polymer film pattern is then formed on the first material film. The plasma polymer film pattern is used as a mask, and the first material film of the element formation region is etched. Subsequently, the first material film pattern of the remaining field region is used as the mask, and the thick insulating film on the element formation region is etched and eliminated. The desired elements are deposited on the exposed substrate surface.

According to the method for producing a semiconductor device, the field stopper and the thick insulating film are formed in one photolithography process on the field region by utilizing the same technique as in the selective oxidation method. Further, the method according to the present invention provides an advantage in that the decrease in the dielectric strength of the gate oxide film due to the use of the silicon nitride film is avoided since the silicon nitride film having oxidation resistance need not be used.

Recently, among the etching techniques, the reactive sputtering etching method has been developed. When the reactive sputtering etching method is used, a mask pattern is transferred to a material to be etched, without side etching. Therefore, in the method according to the present invention, if the reactive sputtering etching technique is adopted for etching the thick insulating film on the substrate, the area for the element formation region becomes wider than the conventional method in which the bird's beaks are formed, so that the packaging density of the elements is greatly increased.

Further, according to the present invention, annealing is not required for a long period of time after ion implantation so that degradation of element characteristics due to relocation of the field stopper is prevented. The second material film, for example, an SiO$_2$ film, is deposited to eliminate deposition of the plasma polymer film in the plasma atmosphere after the first material film is deposited. The second material film is patterned and exposed in the plasma atmosphere so that a plasma polymer film is selectively deposited on the first material film which, in turn, is on the field region. Reliability of etching and patterning using the plasma polymer film is greatly improved, and element isolation is guaranteed. Therefore, the yield of the products increases.

The method according to the present invention is not limited to production of MOS type semiconductor devices, but may be extended to production of bipolar type semiconductor devices.

The present invention will be described in detail by way of its examples.

EXAMPLE 1

Example 1 shows a case in which the method according to the present invention is applied to pattern formation on an aluminum film.

Figure 3A:
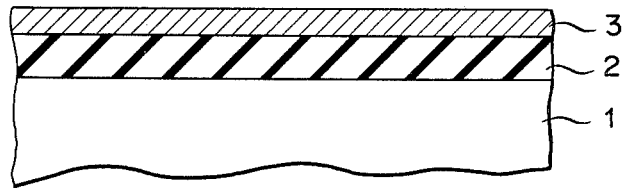
FIGS. 3A to 3E are sectional views of one embodiment of a semiconductor device when applied to aluminum film patterning.
Figure 3B:
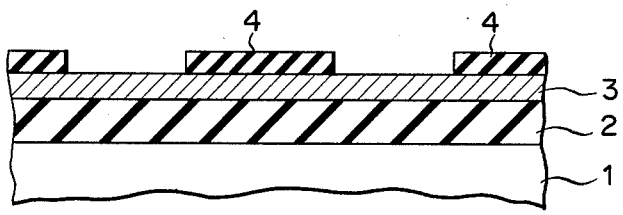
Figure 3C:
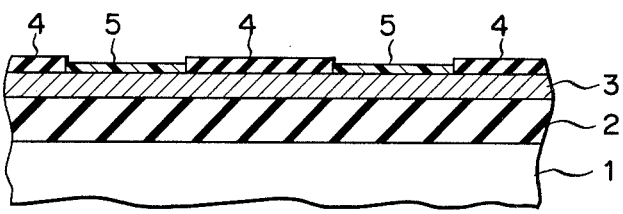
Figure 3D:
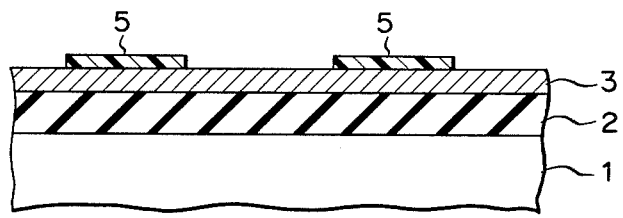
Figure 3E:
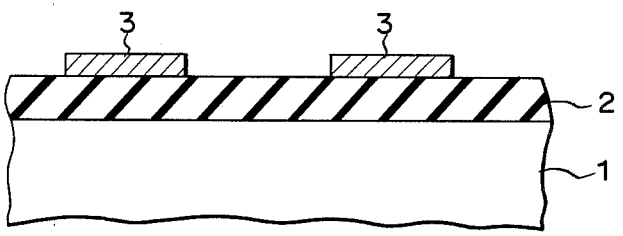

Referring to FIG. 3A, a thick oxide film 2 which has a thickness of about 0.7 μm is deposited on a silicon substrate 1. An Al film (first material film) 3 is formed thereon to a thickness of about 0.8 μm in order to form an interconnection electrode pattern. Referring to FIG. 3B, an SiO$_2$ film (second material film) 4 is formed by, for example, the plasma CVD method, to a thickness of about 0.5 μm on the Al film 3. Thereafter, the SiO$_2$ film pattern is formed by general photolithography. Reactive ion etching is performed under the following conditions: the RF power is 0.22 W/cm$^2$, the pressure is 10 m Torr, the flow rate of CF$_4$ is 21 ml/min, and the flow rate of H$_2$ is 18 ml/min. The SiO$_2$ film 4 is etched at a rate of 400 Å/min while a plasma polymer film is deposited at a rate of about 100 A/min on the exposed surface of the Al film 3. This reactive ion etching is performed for about 8 minutes, and the SiO$_2$ film 4 is etched and the film thickness is reduced by about 3,000 Å, as shown in FIG. 3C. On the exposed Al film 3 is deposited a plasma polymer film 5 which has a thickness of about 800 Å. The SiO$_2$ film 4 is then removed by, for example, fluoric acid as shown in FIG. 3D. The plasma polymer film 5 is used as a mask and the Al film 3 is etched under proper etching conditions to form a pattern of the Al film 3. Etching of the Al film 3 may be performed by the reactive ion etching method, the general dry etching method or the wet etching method using a liquid etchant. Thereafter, the O$_2$ plasma ashing is performed to remove the plasma polymer film 5. In this manner, the desired interconnection electrode pattern of the Al film 3 is formed, as shown in FIG. 3E.

According to the method according to Example 1, the plasma polymer film which is used as the mask for etching the Al film has excellent resistance to etching as compared with the mask used in the conventional mask transfer method. Further, stress is not generated between the Al film and the mask, and no chemical reaction occurs in the interface therebetween. After the pattern is formed, the plasma polymer film used as the mask is easily eliminated. Furthermore, the plasma polymer film used as the mask provides good step coverage in the level difference of the films, so that irregular pattern formation caused by nonuniform film thickness at the edges of the etching mask where level differences are present is prevented as compared with the conventional pattern forming method, thus providing pattern formation with high reliability.

In Example 1, patterning of the Al film is described. However, even if the first material film is a low resistant metal film other than aluminum, a polycrystalline silicon film, a single-crystalline silicon film, a silicon nitride film, a copolymer film or the like, the same results are obtained as described in the embodiment above, by using a silicon oxide film as the second material film.

Examples 2 and 3 show a case in which the method according to the present invention is applied to production of an MOS type semiconductor device.

EXAMPLE 2

Figure 4A:
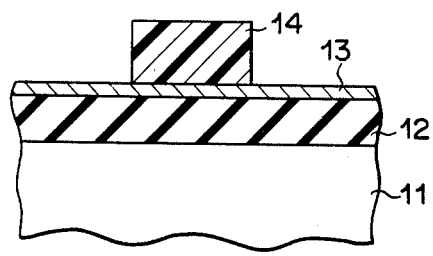
FIGS. 4A to 4F are sectional views of another embodiment of the present invention which is applied to produce an MOS type semiconductor device.
Figure 4D:
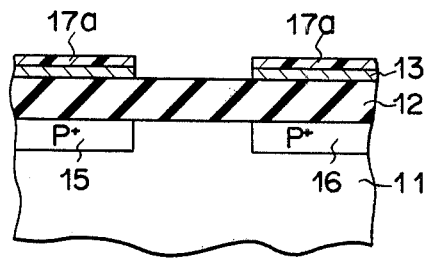
Figure 4B:
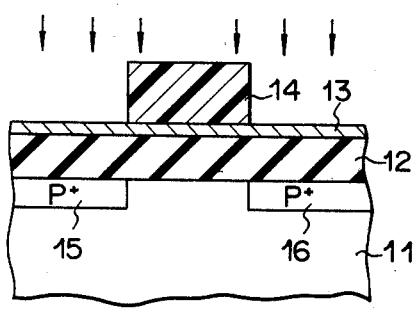

A p-type silicon substrate 11 having a crystal orientation of (100) and a specific resistance of 5 to 20 Ωcm is used. A silicon oxide film 12 is formed thereon to a thickness of about 7,000 Å by thermal oxidation as shown in FIG. 4A. A polycrystalline silicon film 13 is then deposited on the silicon oxide film 12 to a thickness of about 1,500 Å by, for example, the CVD method. Thereafter, a resist film 14 is formed on the element formation region by general photolithography. The resist film 14 is used as a mask and boron ions are implanted in the field region of the silicon substrate to form layers 15 and 16 as shown in FIG. 4B. The acceleration voltage of the boron is preferably at about 350 kV.

Figure 4E:
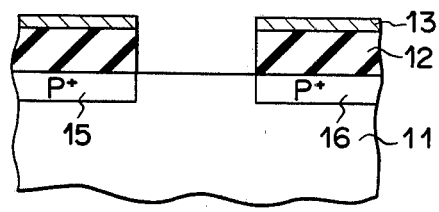
Figure 4C:
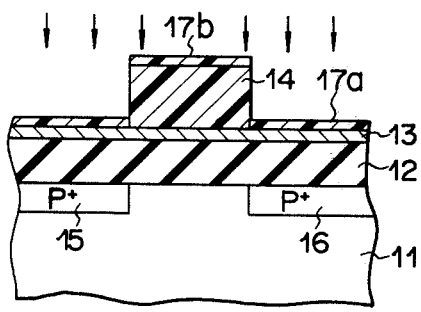

As shown in FIG. 4C, the obtained structure is exposed to a plasma atmosphere containing gas mixture of $CF_4$ and $H_2$ in reactive sputtering etching. When the proportion of $H_2$ gas to the gas mixture exceeds 50%, a plasma polymer film 17a of $CF_x$ is deposited on the polycrystalline silicon film 13. At the same time, a plasma polymer film 17b is deposited on the resist film 14. However, the plasma polymer film 17b is removed by removing the resist film 14. FIG. 4D shows a case in which the resist film 14 and the plasma polymer film 17b thereon are removed together in a boiling aqueous solution of sulfuric acid and hydrogen peroxide. Although the plasma polymer film 17a formed on the polycrystalline silicon film 13 is partially etched, the plasma polymer film 17a sufficiently acts as a mask for etching the polycrystalline silicon film. Referring to FIG. 4D, the polycrystalline silicon film on the element formation region is etched to be removed by using the plasma polymer film 17a as a mask. Further, the silicon oxide film 12 of the element formation region is etched by, for example, the reactive sputtering etching method, using the polycrystalline silicon film 13 as an etching mask, as shown in FIG. 4E.

Figure 4F:
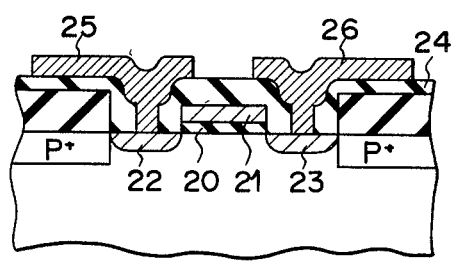

In accordance with a known method, a gate oxide film 20 is formed, and a gate electrode 21 of a polycrystalline silicon film is deposited over the gate oxide film 20, as shown in FIG. 4F. Further, an n-type impurity such as arsenic is doped to form an n-type source region 22 and an n-type drain region 23. Thereafter, a silicon oxide film 24 is deposited on the entire surface by the CVD method, and contact holes are formed to deposit electrodes 25 and 26.

Referring to FIG. 4E, when the polycrystalline silicon film formed on the field oxide film which is used as the mask is oxidized, the field oxide film is made thick and the edges of the field oxide film are rounded so that disconnections of the metal interconnection electrode at corners are effectively reduced. In the embodiment according to the present invention, the plasma polymer film 17a is deposited on the polycrystalline silicon film 13. However, a film which allows deposition of a plasma polymer film, such as an aluminum film, as alumina film or a silicon nitride film, may be used in place of the polycrystalline silicon film 13.

According to Example 2, a thick insulating film and a channel stopper are formed in the field region by self-alignment in one photolithography process, in the same manner as in the selective oxidation method. Further, drawbacks of the selective oxidation method described above are eliminated.

According to the method of the present invention, the silicon nitride film which has a resistance to oxidation need not be used, so that degradation of the dielectric strength of the gate oxide film due to the use of the silicon nitride film is eliminated.

Furthermore, the field insulating film is etched by reactive sputtering etcing, so that the pattern dimentional change becomes substantially zero. The area of the element formation region becomes wider than that obtained by the conventional selective oxidation method. Therefore, the packaging density of the elements is greatly increased. For example, when a dRAM memory is arranged in a unit of $3\mu$ rule, the packaging density of the elements according to the method of the present invention will be increased by at least 50%. The present invention does not require annealing for a long period of time after ion implantation, so that degration of the element characteristics due to relocation of the field stopper is greatly reduced.

EXAMPLE 3

In Example 2, the plasma polymer films 17a is formed on the polycrystalline silicon film 13, as shown in FIG. 4C; the plasma polymer film 17b is also formed on the resist film 14. During etching of the resist film 14, the plasma polymer film 17a is made thinner. Further, since boron is implanted by using the resist film 14 as a mask, the film thickness of the resist film 14 must be made great. These problems are eliminated in Example 3.

Figure 5A:
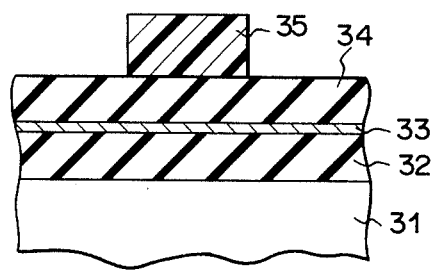
FIGS. 5A to 5E are sectional views of still another embodiment of the present invention which is applied to produce another MOS type semiconductor device.

As shown in FIG. 5A, a silicon oxide film 32 is deposited on a silicon substrate 31 as in Example 2, and a polycrystalline silicon film 33 is deposited thereover. A silicon oxide film 34 which has a thickness of about 7,000 Å is formed thereover by the CVD method.

Figure 5D:
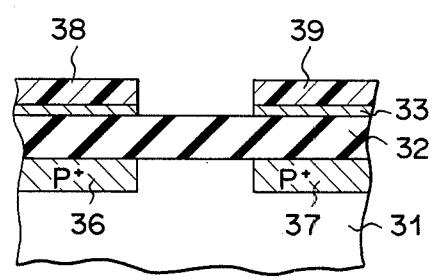
Figure 5B:
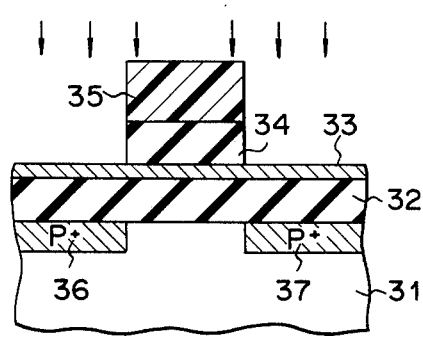

Thereafter, a resist film 35 is formed on the element formation region by general photolithography. As shown in FIG. 5B, the silicon oxide film 34 is patterned by reactive sputtering. The resist film 35 and the silicon oxide film 34 are used as masks, and then boron is implanted to form field stoppers 36 and 37.

Figure 5E:
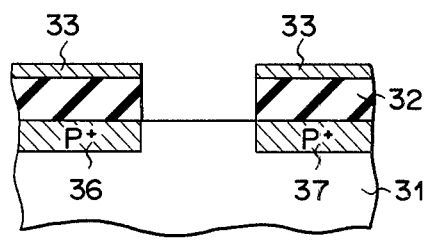
Figure 5C:
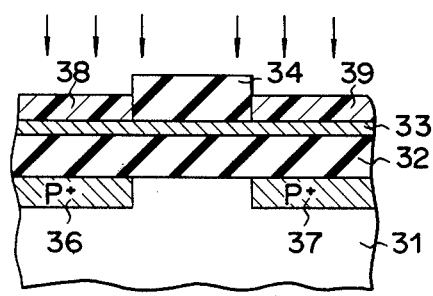

After the resist film 35 is removed as shown in FIG. 5C, reactive sputtering is performed in an atmosphere of a gas mixture of $CF_4$ and $H_2$. When the silicon oxide film 34 is partially etched, plasma polymer films 38 and 39 of $CF_x$ are deposited on the polycrystalline silicon film 33. In this manner, part of the silicon oxide film 34 remains. Subsequently, the silicon oxide film 34 is etched and removed and the plasma polymer films 38 and 39 are used as masks to etch the polycrystalline silicon film 33 as shown in FIG. 5D. Thereafter, as shown in FIG. 5E, the plasma polymer films 38 and 39 are eliminated by oxygen plasma etching and the polycrystalline silicon film 33 is used as the mask to etch the silicon oxide film 32 of the element formation region to form the element isolation region. The subsequent steps are the same as in Example 2. The elements are deposited on the exposed silicon surface.

Since the silicon oxide film 34 and the resist film 35 are used as masks for ion implantation in order to form the field stopper according to the method of the present invention, the impurity is not implanted in the element formation region of the silicon substrate.

When the structure is exposed to the plasma atmosphere, the silicon oxide film 34 is etched while the plasma polymer films 38 and 39 are only deposited on the polycrystalline silicon film 33. Therefore, when the silicon oxide film 34 is etched by, for example, a solution of ammonium fluoride, the plasma polymer films 38 and 39 are not substantially etched, so that patterning of the polycrystalline silicon film 33 is performed by the plasma polymer films 38 and 39 with high reliability.

What is claimed is:
1. A method for producing a semiconductor device comprising the steps of:
   forming a first material film on a semiconductor substrate;

forming a second material film on said first material film;

selectively removing said second material film;

exposing a structure thus formed to a gas plasma atmosphere to form a plasma polymerization film on at least an exposed surface of said first material film;

removing a remainder of said second material film; and removing the exposed surface of said first material film by using said plasma polymerization film as a mask to form a first material film pattern.

2. A method according to claim 1, wherein said gas plasma is a reactive ion etching atmosphere using a gas containing hydrogen and a CF bond.

3. A method according to claim 2, wherein said gas containing hydrogen and a CF bond is a gas mixture of a fluorocarbon gas and hydrogen gas.

4. A method according to claim 3, wherein said fluorocarbon is at least one member selected from the group consisting of $CF_4$, $C_2F_6$ and $C_3F_8$.

5. A method according to claim 3, wherein a proportion of said hydrogen gas is at least 30% of said gas mixture.

6. A method according to any one of claims 1 to 5, wherein said first material film is a member selected from the group consisting of a metal, silicon, polysilicon, silicon nitride, and a polymer.

7. A method according to claim 6, wherein said second material film is made of silicon oxide, said first material film being partially etched when said second material film is exposed to said gas plasma atmosphere.

8. A method according to claim 6, wherein said second material film is a photoresist film, a polymer being deposited on the surface of said second material film when said second material film is exposed to said gas plasma atmosphere, and said polymer deposited on said second material film being removed when said second material film is removed.

9. A method according to any of claims 1 to 5, further comprising the steps of ion-implanting an impurity within said semiconductor substrate through said exposed surface of said first material film after said second material film is selectively etched; after a first insulating film pattern is formed, etching an insulating film below said first insulating film pattern by using said first insulating film pattern as a mask and exposing part of said semiconductor substrate; and forming an element in an exposed region of said semiconductor substrate.

* * * * *